United States Patent
Li

(10) Patent No.: US 7,792,223 B2
(45) Date of Patent: Sep. 7, 2010

(54) METHOD AND SYSTEM FOR DEMODULATING DATA SIGNALS

(75) Inventor: Shaoming Li, Shenzhen (CN)

(73) Assignee: Huawei Technologies Co., Ltd., Guangdong Province (CN)

( * ) Notice: Subject to any disclaimer, the term of this patent is extended or adjusted under 35 U.S.C. 154(b) by 697 days.

(21) Appl. No.: 11/690,805

(22) Filed: Mar. 24, 2007

(65) Prior Publication Data
US 2008/0075203 A1 Mar. 27, 2008

(30) Foreign Application Priority Data
Sep. 25, 2006 (CN) .................. 2006 1 0152401

(51) Int. Cl.
*H04L 27/06* (2006.01)
(52) U.S. Cl. .................. 375/341; 375/261; 375/298; 375/304; 375/332; 375/340; 329/304; 329/306
(58) Field of Classification Search ........... 375/340–41, 375/261, 298, 304, 332; 329/304, 306
See application file for complete search history.

(56) References Cited
U.S. PATENT DOCUMENTS

| 5,355,092 | A | 10/1994 | Kosaka et al. | |
| 7,003,709 | B2 * | 2/2006 | Wengerter et al. | 714/748 |
| 7,218,689 | B2 * | 5/2007 | Gupta | 375/340 |
| 2002/0131515 | A1 * | 9/2002 | Rodriguez | 375/262 |
| 2003/0103584 | A1 * | 6/2003 | Bjerke et al. | 375/340 |
| 2003/0103585 | A1 * | 6/2003 | Kim et al. | 375/340 |
| 2003/0145269 | A1 * | 7/2003 | Kuo et al. | 714/749 |
| 2003/0217319 | A1 * | 11/2003 | Tripathi et al. | 714/751 |
| 2005/0083797 | A1 | 4/2005 | Shigeeda et al. | |

* cited by examiner

*Primary Examiner*—David C Payne
*Assistant Examiner*—Leon Flores
(74) *Attorney, Agent, or Firm*—Townsend and Townsend and Crew LLP

(57) ABSTRACT

Method and system for demodulating data signals. According to an embodiment, the present invention provides a method for demodulating data signals. The method includes a step for receiving modulated data over a medium. The modulated data represents a plurality of bits, which includes at least a first bit. For example, the first bit is modulated by a number of modulation processes using a sequence of modulation symbols, and each of the sequence of modulation symbols is selected from a first plurality of modulation symbols. The method also includes a step for processing information associated with the first plurality of modulation symbols and the number of modulation processes. Also, the method includes a step for determining a plurality of sequences of modulation symbols based on at least information associated with the first plurality of modulation symbols and the number of modulation processes.

19 Claims, 5 Drawing Sheets

METHOD AND SYSTEM FOR DEMODULATING DATA SIGNALS

CROSS-REFERENCES TO RELATED APPLICATIONS

This application claims priority to Chinese Patent Application No. 200610152401.4, filed Sep. 25, 2006, incorporated by reference herein for all purposes.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention relates in general to telecommunication techniques. More particularly, the invention provides a system and method for improving the accuracy of demodulating received data signals. In certain specific embodiments, statistical tools have been implemented for detecting possible errors of data transmission. Merely by way of example, the invention is described as it applies to communication networks, but it should be recognized that the invention has a broader range of applicability.

Telecommunication techniques existed almost as long as human history. Before electrical means of information exchange were possible, people devised various techniques for transmit information over distances. Visual and/or audio relay techniques for transmitting information over long distances have been used. For example, thousands of years ago border patrols in China used smoke signals to warn the central government of foreign invasions. Native Americans have also been known to use smoke signals.

With the invention of telegraph in the early nineteenth century, various electrical means of transmitting information have been developed. For example, various type of technologies (e.g., telephone, facsimile, radio, etc.) have been developed.

In a transmission process, the information that is typically modulated at the transmitting end, demodulated at the receiving end, and transmitted through a medium. For example, digital transmission of data typically involves the following steps: (1) encoding data, (2) modulating data, (3) transmitting data over a medium, (4) demodulating data, and (5) decoding data. Typically, during the transmission over a medium (e.g., wire, air, etc.), modulated data suffer from both noise and attenuation loss. Therefore it is often necessary to determine whether the transmitted data contain any errors.

One of a commonly used methods for detecting error is hybrid automatic request (HARQ) method, which offers good performance for many types of network work and particularly wireless networks. The application of HARQ method is described below.

At the transmitting end, a data frame is encoded in a code word, and a code word is divided into several segments. Each code word segment includes several code word symbols. The transmitting end selects one or multiple code word segments in each transmission, and a concrete number of segments and code word symbols are constrained by the resource. These code word symbols are modulated to generate several modulation symbols, and then these modulation symbols are sent out.

The receiving end decodes the currently received and/or previously received code word segments. If the decoding is successful, then it feeds back a transmission successful message to the transmitting end, and transmission of data frame is complete. If decoding fails, then it feeds back a failure message to the transmitting end. The transmitting end then carries out an HARQ for retransmission of this data frame for the second attempt. Typically, the code word segments chosen for retransmission might be the same or different compared with the previous transmission/transmissions. Depending upon application, mapping of the encoding symbols to modulation symbols also might be changed, and the modulation order might be changed as well. For example, in HARQ transmission of a "Modulation Order Step-Down" mode, the code word symbols for HARQ transmission might use Quadrature amplitude modulation (QAM) (e.g., 16QAM) to modulate for the first time, and the code word symbol for HARQ transmission might use Phase-shift keying (e.g., 8PSK) to modulate for the second time.

FIG. 1 is a simplified diagram illustrating operation of an HARQ system. This diagram is merely an example, which should not unduly limit the scope of the claims. One of ordinary skill in the art would recognize many variations, alternatives, and modifications. As shown in FIG. 1, the ($b_0$, $b_1$, ..., $b_{m-1}$) row represents coding symbols, the ($S_0$, $S_1$, ..., $S_{n-1}$) row represents modulation symbols, and the connecting line between the coding symbols and the modulation symbols represents certain coding symbols that were used for generating of certain modulation symbols. The coding symbols have more than one connecting lines, which represents this coding symbol has been repeatedly transmitted during HARQ transmission.

To further explain the operation of an HARQ system, the following expressions are presented below. The mapping procedure from coding symbols to modulation symbols is one-to-one mapping procedure as the followings:

$$\phi: \vec{b}=(b_0, b_1, \ldots, b_{m-1}) \rightarrow \vec{s}=(s_0, s_1, \ldots, s_{n-1}) \quad \text{(Equation 1)}$$

$$\phi^{-1}: \vec{s}=(s_0, s_1, \ldots, s_{n-1}) \rightarrow \vec{b}=(b_0, b_1, \ldots, b_{m-1}) \quad \text{(Equation 2)}$$

Where, $\vec{b}=(b_0, b_1, \ldots, b_{m-1})$ represents the vector of the coding symbols, $\vec{r}=(r_0, r_1, \ldots, r_{n-1})$ represents the vector of the received symbols, and $\vec{s}=(s_0, s_1, \ldots, s_{n-1})$ represents the vector of the transmitted modulation symbols.

As an example, Equation 1 describes the operation of modulating coding symbols, and Equation 2 describes the operation of demodulating received signals. It is desired that the coding symbols after demodulation are the same as before modulation (i.e., data being faithfully transmitted). To ensure that the demodulated received signals are accurate, various conventional techniques have been developed. For example, log likelihood ratio (LLR) value is used to determine the likelihood of the received signals being accurate. As an example, upon determining the LLR value for a demodulated signals is lower than a threshold LLR value, the receiver of the signals send a request for resending data. Unfortunately, conventional techniques are often inadequate.

Therefore, an improved method and system for demodulation is desired.

BRIEF SUMMARY OF THE INVENTION

The present invention relates in general to telecommunication techniques. More particularly, the invention provides a system and method for improving the accuracy of demodulating received data signals. In certain specific embodiments, statistical tools have been implemented for detecting possible errors of data transmission. Merely by way of example, the invention is described as it applies to communication networks, but it should be recognized that the invention has a broader range of applicability.

According to an embodiment, the present invention provides a method for demodulating data signals. The method includes a step for receiving modulated data over a medium. The modulated data represents a plurality of bits, which includes at least a first bit. For example, the first bit is modulated by a number of modulation processes using a sequence of modulation symbols, and each of the sequence of modulation symbols is selected from a first plurality of modulation symbols. The method also includes a step for processing information associated with the first plurality of modulation symbols and the number of modulation processes. Also, the method includes a step for determining a plurality of sequences of modulation symbols based on at least information associated with the first plurality of modulation symbols and the number of modulation processes. The method further includes a step for determining a first plurality of probability values for the first bit being zero. As an example, each of the probability values is associated with one of the plurality of sequences and the modulated data. Additionally, the method includes a step for determining a second plurality of probability values for the first bit being nonzero. For example, each of the probability values being associated with one of the plurality of sequences and the modulated data. The method also includes a step for determining a first sum associated with the first plurality of probability values. The method further includes a step for determining a second sum associated with the second plurality of probability values. Furthermore, the method includes a step for determining a ratio between the first sum and the second sum.

According to another embodiment, the present invention provides a method for demodulating received data signals. The method includes a step for receiving modulated data from a data source over a medium. For example, the modulated data represents a plurality of bits, which include at least a first bit. For example, the first bit is modulated by the data source using a predetermined first plurality of modulation symbols. The first plurality of modulation symbols is a subset of a second plurality of modulation symbols. The method also includes a step for determining a number of modulation symbols used for modulating the first bit. Additionally, the method includes a step for providing a set of permutations of possible modulation symbols based on the number of modulation symbols. Furthermore, the method includes a step for providing a noise value that is associated with the medium. The method further provides a step for providing an attenuation value that is associated with the medium. The method additionally includes a step for determining a first minimum value for a first plurality of probability values for first bit being zero. For example, each of the probability values is associated with a permutation, and each of the probability values is a function of the noise value, the attenuation value, and the modulated data. Also, the method includes a step for determining a second minimum value for second plurality of probability values for first bit being nonzero. As an example, each of the probability values is associated with a permutation, and each of the probability values further being a function of the noise value, the attenuation value, and the modulated data. Moreover, the method includes a step for determining a ratio between the first minimum value and the second minimum value.

According to yet another embodiment, the present invention provides a method for demodulating received signals. The method includes a step for receiving modulated data from a data source over a medium. The modulated data represents a plurality of bits, which includes at least a first bit. For example, the first bit is modulated by the data source using a known number of a predetermined first plurality of modulation symbols. The first plurality of modulation symbols is a subset of a second plurality of modulation symbols. The method additionally includes a step for determining a number of modulation symbols used for modulating the first bit. The method further includes a step for providing a noise value, which is associated with the medium. The method also includes a step for providing an attenuation value, which is associated with the medium. In addition, the method includes a step for providing a first tree structure for determining a likelihood of the first bit being zero. For example, the first tree structure includes a number of branch levels. The number of levels is equal to known number of the predetermined first plurality of modulation symbols. The first tree includes a first plurality of nodes. The method additionally includes a step for determining a first plurality of branch value. For example, each of the branch values is associated with a node from the first plurality of nodes. Also, the method includes a step for determining a first sum based on the first plurality of branch values. Moreover, the method includes a step for providing a second tree structure for determining a likelihood of the first bit being non-zero. For example, the second tree structure includes the number of branch levels, the second tree including a second plurality of nodes. The method also includes a step for determining a second plurality of branch values, and each of the branch values is associated with a node from the second plurality of nodes. Furthermore, the method includes a step for determining a second sum based on the second plurality of branch values. Also, the method includes a step for determining a ratio between the first sum and the second sum.

According to yet another embodiment, the present invention provides a method for demodulating received data signals. The method includes a step for receiving modulated data from a data source over a medium. The modulated data represents a plurality of bits, which includes at least a first bit. As an example, the first bit is modulated by the data source using a known number of a predetermined first plurality of modulation symbols. The first plurality of modulation symbols is a subset of a second plurality of modulation symbols. The method also includes a step for determining a number of modulation symbols used for modulating the first bit. The method additionally includes a step for providing a noise value, which is associated with the medium. The method additionally includes a step for providing an attenuation value, which is associated with the medium. The method further includes a step for providing a first tree structure for determining a likelihood of the first bit being zero. The first tree structure includes a number of branch levels. For example, the number of levels is equal to known number of the predetermined first plurality of modulation symbols. The first tree includes a first plurality of nodes. The method also includes a step for determining a first plurality of branch values, and each of the branch values is associated with a node from the first plurality of nodes. Furthermore, the method includes a step for determining a first minimum based on the first plurality of branch values. Moreover, the method includes a step for providing a second tree structure for determining a likelihood of the first bit being non-zero. The second tree structure includes the number of branch levels. The second tree includes a second plurality of nodes. The method additionally includes a step for determining a second plurality of branch values, and each of the branch values being associated with a node from the second plurality of nodes. The method additionally includes a step for determining a second minimum based on the second plurality of branch values. The method also includes a step for determining a ratio between the first minimum and the second minimum.

According to yet another embodiment, the present invention provides a system for demodulating data signals. The system includes a communication interface that is configured for receiving modulated data over a medium. The modulated data represents a plurality of bits, which includes at least a first bit. As an example, the first bit is modulated by a number of modulation processes using a sequence of modulation symbols. Each of the sequence of modulation symbols is selected from a first plurality of modulation symbols. The system also includes a processor that is configured to process information associated with the first plurality of modulation symbols and the number of modulation processes. The processor is also configured to determine a plurality of sequences of modulation symbols based on at least information associated with the first plurality of modulation symbols and the number of modulation processes. The processor is additionally configured to determine a first plurality of probability values for the first bit being zero, and each of the probability values is associated with one of the plurality of sequences and the modulated data. The processor is additionally configured to determine a second plurality of probability values for the first bit being nonzero, and each of the probability values is associated with one of the plurality of sequences and the modulated data. Also, the processor is configured to determine a first sum associated with the first plurality of probability values. The processor is further configured to determine a second sum associated with the second plurality of probability values. Moreover, the processor is configured to determine a ratio between the first sum and the second sum.

It is to be appreciated that embodiments of the present invention provide various advantages over conventional techniques. Among other things, various embodiments of the present invention provides a more accurate way for determining a log likelihood ratio associated with data transmission, as illustrated in the specification of the application. In addition, certain embodiments of the present invention provide a method for approximating the log likelihood value in an efficient manner. Additionally, various embodiments of the present invention are compatible with conventional process technology without substantial modifications to conventional equipment and processes. Depending upon the embodiment, one or more of these benefits may be achieved. These and other benefits will be described in more throughout the present specification and more particularly below.

Depending upon embodiment, one or more of these benefits may be achieved. These benefits and various additional objects, features and advantages of the present invention can be fully appreciated with reference to the detailed description and accompanying drawings that follow.

DETAILED DESCRIPTION OF THE INVENTION

The present invention relates in general to telecommunication techniques. More particularly, the invention provides a system and method for improving the accuracy of demodulating received data signals. In certain specific embodiments, statistical tools have been implemented for detecting possible errors of data transmission. Merely by way of example, the invention is described as it applies to communication networks, but it should be recognized that the invention has a broader range of applicability.

As described above, HARQ systems and method are used for many types of data transmission. Often, LLR values are determined for the purpose of error checking. Among other things, the LLR value can be used to indicate the confidence level of the accuracy of demodulated data. For example, the LLR value indicates how much more likely it is for a received bit to be "1" than to be "0".

A conventional technique and the shortcomings thereof are described below.

When data are transmitted over a medium, fidelity of the data often degrade due to noise and attenuation. The relationship between data before and after transmission may be expressed by the following equations.

$$r_k = h_k s_k + n_k,\ n_k \sim CN(0, \sigma_k^2), k = 0, 1, \ldots n-1 \quad \text{(Equation 3)}$$

According to equation 3, $r_k$ represents the received signal, which is the sum of $h_k s_k$ (the modulation signal $s_k$ after attenuation $h_k$) and $n_k$ represent noise. The term $CN(0, \sigma_i^2)$ is the complex Gaussian distribution with the mean value of 0 and the variance of $\sigma_i^2$.

Figure 1:
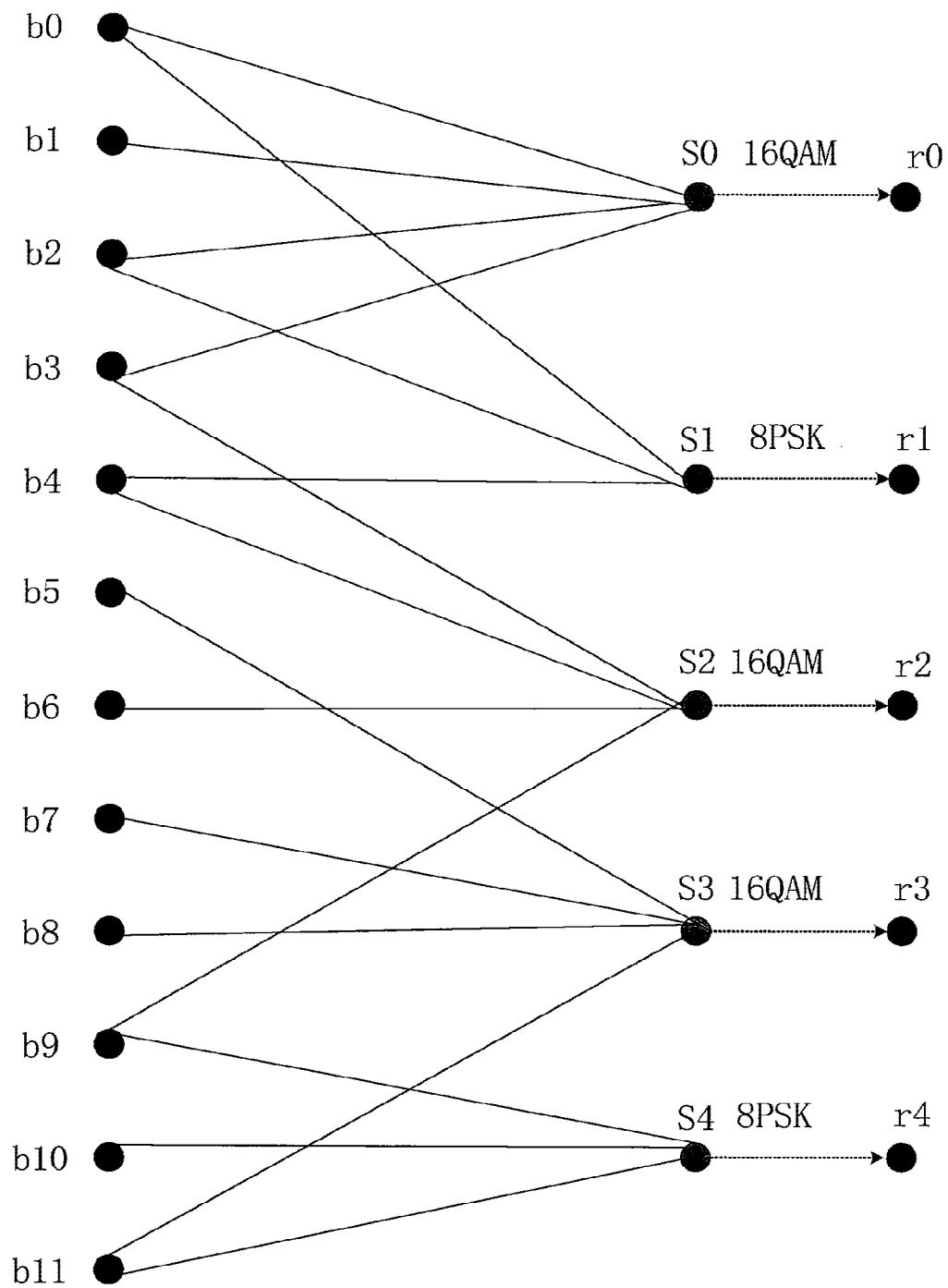
FIG. 1 is a simplified diagram illustrating operation of an HARQ system.

Now referring back to FIG. 1. In a calculation for LLR that corresponds to each of the modulation signal according to the conventional technique, the following equation is used.

$$LLR_k(b_i) \approx (-1)\left(\min_{s'_k \in set(b_i=0)} \tilde{d}(r_k, s'_k) - \min_{s'_k \in set(b_i=1)} \tilde{d}(r_k, s'_k)\right), \quad \text{(Equation 4)}$$

$$k \in 0, 1, \ldots n-1$$

The term $\tilde{d}(r_k, s'_k)$ is a modified Euclid distance between $r_k$ and $s'_k$ defined by the following equation.

$$\tilde{d}(r_k, s'_k) = \frac{|r_k - h_k s'_k|^2}{\sigma_i^2} \quad \text{(Equation 5)}$$

The term $s'_k$ is defined by the following equation.

$$s'_k \in set(b_i=0) \quad \text{(Equation 6)}$$

Equation 6 represents the modulation symbol of the corresponding $b_i=0$ in $s_k$ modulation constellation point.

In a calculation for LLR that corresponds to a particular value of $b_i$, the summary of $LLR_k(bi)$ is determined according to the following equation.

$$LLR(b_i) = \sum_k LLR_k(b_i) \quad \text{(Equation 7)}$$

$$= (-1) \sum_k \left( \min_{s'_k \in set(b_i=0)} \tilde{d}(r_k, s'_k) - \min_{s'_k \in set(b_i=1)} \tilde{d}(r_k, s'_k) \right)$$

$$= (-1) \left( \sum_k \min_{s'_k \in set(b_i=0)} \tilde{d}(r_k, s'_k) - \sum_k \min_{s'_k \in set(b_i=1)} \tilde{d}(r_k, s'_k) \right)$$

$$k \in 0, 1, \ldots n-1$$

Various conventional techniques for determining the likelihood of the demodulated data signals being accurate utilize Equation 7 to calculate the LLR value. Unfortunately, Equation 7 is often inadequate (and sometimes incorrect) for this purpose. The shortcomings of Equation 7 as used in conventional techniques are explained below.

To calculate the LLR of the coding symbol bi, a Bayes formula is used as shown below.

$$LLR(b_i) = \ln\left( \frac{Pr(b_i=0|\vec{r})}{Pr(b_i=1|\vec{r})} \right) \quad \text{(Equation 8)}$$

$$= \ln\left( \frac{Pr(b_i=0|\vec{r}_{sub})}{Pr(b_i=1|\vec{r}_{sub})} \right)$$

$$= \ln\left( \frac{Pr(\vec{r}_{sub}|b_i=0)Pr(b_i=0)}{Pr(\vec{r}_{sub}|b_i=1)Pr(b_i=1)} \right)$$

$$= \ln\left( \frac{\sum_{\vec{s}'_{sub} \in set(b_i=0)} Pr(\vec{r}_{sub}|\vec{s}'_{sub})Pr(\vec{s}'_{sub})}{\sum_{\vec{s}'_{sub} \in set(b_i=1)} Pr(\vec{r}_{sub}|\vec{s}'_{sub})Pr(\vec{s}'_{sub})} \right)$$

According to Equation 8, $\vec{r}=(r_0, r_1, \ldots, r_{n-1})$ represents a vector set of received symbols, and $$\vec{s}'_{sub} = (s_{k_1}, s_{k_2}, \ldots, s_{k_{count(b_i)}})$$

represents a vector set of modulated symbols based on $b_i$. The variable $$\vec{r}_{sub} = (r_{k_1}, r_{k_2}, \ldots, r_{k_{count(b_i)}})$$

represents a vector set of received symbols based on modulated symbols of corresponding to coding symbols represented by $b_i$. Terms $k_1, k_2, \ldots, k_{count(b_i)}$ represent the label of the modulation symbol of $b_i$ used in modulation. The term count($b_i$) represents the number of the modulation symbol of $b_i$ used in modulation. The term $Pr(\vec{s}'_{sub})$ represents a prior probability for the modulated symbols $\vec{s}'_{sub}$ used under the condition that (1) each of $b_i$, (i=0, 1, . . . m−1), is mutually independent from another, (2) probability of zero and one are equal, and (3) the prior probability of the occurrence for each $S'_{sub}$ is equal. The term $Pr(\vec{r}_{sub}|\vec{s}'_{sub})$ represents a conditional probability for received symbols to be $\vec{r}$, under the condition that the modulated symbols are $\vec{s}'_{sub}$. The term set($b_i$=0) represents the vector set $\vec{s}'_{sub}$ corresponding to $b_i$=0, and can be expressed according to be following equation.

$$set(b_i = 0) = \{\vec{s}'_{sub}|\varphi^{-1}(\vec{s}'_{sub} = (s_{k_1}, s_{k_2}, \ldots, s_{k_{count(b_i)}})) = \quad \text{(Equation 9)}$$
$$(b_0, b_1, \ldots b_i = 0, \ldots, b_{m-1})\}$$

Similarly, The term set($b_i$=1) represents the vector set $\vec{s}'_{sub}$ corresponding to $b_i$=1, and can be expressed according to be following equation.

$$set(b_i = 1) = \quad \text{(Equation 10)}$$
$$\{\vec{s}'_{sub}|\varphi^{-1}(\vec{s}'_{sub} = (s_{k_1}, s_{k_2}, \ldots, s_{k_{count(b_i)}})) = (b_0,$$
$$b_1, \ldots b_i = 1, \ldots, b_{m-1})\}$$

By applying complex Gaussian distribution AWGN noise model, the following equation is obtained.

$$Pr(\vec{r}_{sub}|\vec{s}'_{sub}) = \frac{1}{(\pi)^{count(b_i)} \prod_{k=k_1, \ldots k_{count(b_i)}} \sigma_k^2} \quad \text{(Equation 11)}$$

$$\prod_{k=k_1, \ldots k_{count(b_i)}} e^{\frac{|r_k - h_k s_k|^2}{\sigma_k^2}}$$

$$= \frac{1}{(\pi)^{count(b_i)} \prod_{k=k_1, \ldots k_{count(b_i)}} \sigma_k^2}$$

$$e^{-\sum_{k=k_1, \ldots k_{count(b_i)}} \frac{|r_k - h_k s_k|^2}{\sigma_k^2}}$$

An equation for determining LLR value based on Equation 8 thus can be expressed as the following.

$$LLR(b_i) = \ln\left( \frac{\sum_{\vec{s}'_{sub} \in set(b_i=0)} Pr(\vec{r}_{sub}|\vec{s}'_{sub})}{\sum_{\vec{s}'_{sub} \in set(b_i=1)} Pr(\vec{r}_{sub}|\vec{s}'_{sub})} \right) \quad \text{(Equation 12)}$$

$$= \ln\left( \frac{\sum_{\vec{s}'_{sub} \in set(b_i=0)} e^{-\sum_{k=k_1, \ldots k_{count(b_i)}} \frac{|r_k - h_k s_k|^2}{\sigma_k^2}}}{\sum_{\vec{s}'_{sub} \in set(b_i=1)} e^{-\sum_{k=k_1, \ldots k_{count(b_i)}} \frac{|r_k - h_k s_k|^2}{\sigma_k^2}}} \right)$$

$$= \ln\left( \frac{\sum_{\vec{s}'_{sub} \in set(b_i=0)} e^{-\tilde{d}(\vec{r}_{sub}, \vec{s}'_{sub})}}{\sum_{\vec{s}'_{sub} \in set(b_i=1)} e^{-\tilde{d}(\vec{r}_{sub}, \vec{s}'_{sub})}} \right)$$

It is to be appreciated that Equation 12 as derived above is more accurate than Equation 7 used in conventional techniques.

The Euclid distance between $\vec{r}_{sub}$ and $\vec{s}'_{sub}$ is $\tilde{d}(\vec{r}_{sub}, \vec{s}'_{sub})$, which is expressed as the following.

$$\tilde{d}(\vec{r}_{sub}, \vec{s}'_{sub}) = \sum_{k=k_1,\ldots k_{count(b_i)}} \frac{|r_k - h_k s'_k|^2}{\sigma_k^2} \quad \text{(Equation 13)}$$

$$= \sum_{k=k_1,\ldots k_{count(b_i)}} \tilde{d}(r_k, s'_k)$$

To simplify the calculation process, a Max-log-map approximation as the following is used.

$$\ln\left(\frac{\sum_k e^{-A_k}}{\sum_k e^{-B_k}}\right) = \ln\left(\frac{e^{-\min_k A_k}\left(1+\sum_{k\neq \operatorname{argmin}_k A_k} e^{-(A_k-\min_k A_k)}\right)}{e^{-\min_k B_k}\left(1+\sum_{k\neq \operatorname{argmin}_k B_k} e^{-(B_k-\min_k B_k)}\right)}\right) \quad \text{(Equation 14)}$$

$$\approx \left(\frac{e^{-\min_k A_k}}{e^{-\min_k B_k}}\right)$$

$$= (-1)\left(\min_k A_k - \min_k B_k\right)$$

By applying Equation 14, a simplified method for calculating LLR value is shown below.

$$LLR(b_i) \approx (-1)\left(\min_{\vec{s}'_{sub}\in set(b_i=0)} \tilde{d}(\vec{r}_{sub}, \vec{s}'_{sub}) - \min_{\vec{s}'_{sub}\in set(b_i=1)} \tilde{d}(\vec{r}_{sub}, \vec{s}'_{sub})\right) \quad \text{(Equation 15)}$$

$$= (-1)\left(\min_{\vec{s}'_{sub}\in set(b_i=0)} \sum_{k=k_1,\ldots k_{count(b_i)}} \tilde{d}(r_k, s'_k) - \min_{\vec{s}'_{sub}\in set(b_i=1)} \sum_{k=k_1,\ldots k_{count(b_i)}} \tilde{d}(r_k, s'_k)\right)$$

As explained above, it can be said that Equation 7 that is used in various conventional techniques is often inadequate for determining LLR values that is used in ascertaining data transmission accuracy. It is to be appreciated the Equation 12 as derived in the present invention and implemented accordingly offers a more accurate method for determining LLR values. In an embodiment explained below, a receiver at a communication network utilizes Equation 15 for determining LLR values. For example, a processor is configured to execute codes implementing Equation 15. In another embodiment, a receiver at a communication network utilizes Equation 12 for determining LLR values.

Figure 2:
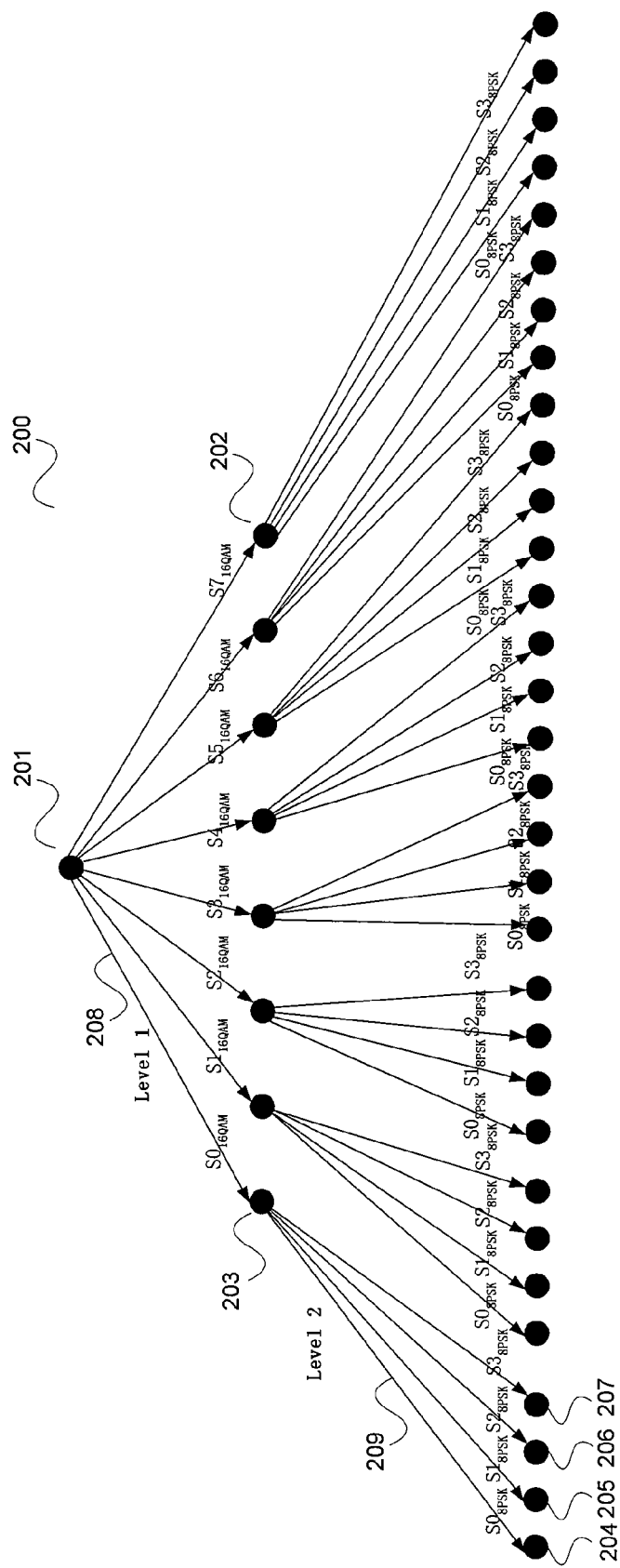
FIG. 2 is a simplified diagram of a tree structure used for facilitating LLR value determination according to an embodiment of the present invention.

A tree structure is used to facilitate calculation of LLR value using Equation 12 according to an embodiment of the present invention. FIG. 2 is a simplified diagram of a tree structure used for facilitating LLR value determination according to an embodiment of the present invention. This diagram is merely an example, which should not unduly limit the scope of the claims. One of ordinary skill in the art would recognize many variations, alternatives, and modifications.

As shown in FIG. 2, the root node 201 represents the total probability of a code bit to be either zero or one. Each of the connecting line between two nodes represents a modulation. For example, line 208 represents the probability of a bit being modulated with modulation code s0 at node 203. Similarly, line 209 represents the probability of a bit being modulated with modulation code s0 at node 203 and modulated with modulation code s0 again at node 204.

To use this structure, various variables are used as described below. The variable $$\vec{s}'_{sub} = \left(s_{k_1}, s_{k_2}, \ldots, s_{k_{count(b_i)}}\right)$$

represents a vector of modulation symbols that were used for modulating code $b_i$, i=0, 1, . . . m−1. The term set($b_i$=0) represents the vector of modulation symbols $$\vec{s}'_{sub} = \left(s_{k_1}, s_{k_2}, \ldots, s_{k_{count(b_i)}}\right)$$

corresponding to $b_i$=0. Similarly, the term set($b_i$=1) represents the vector of modulation symbols $$\vec{s}'_{sub} = \left(s_{k_1}, s_{k_2}, \ldots, s_{k_{count(b_i)}}\right)$$

corresponding to $b_i$=1.

In a specific example, the root node 201 corresponds to the probability of $b_0$=0. Each level (denoted by level i) in the diagram corresponds to $s_{k_i}$ modulation code set is a modulation symbol set corresponding to $b_0$=0.

To determine the probability of $b_0$=0, a path measurement is used for each connecting line of the tree structure 200. A branch metric value is expressed as the following.

$$BM_{s'_{k_i}} = \tilde{d}(r_{k_i}, s'_{k_i}) = \frac{|r_{k_i} - h_{k_i} s'_{k_i}|^2}{\sigma_{k_i}^2} \quad \text{(Equation 16)}$$

Figure 3:
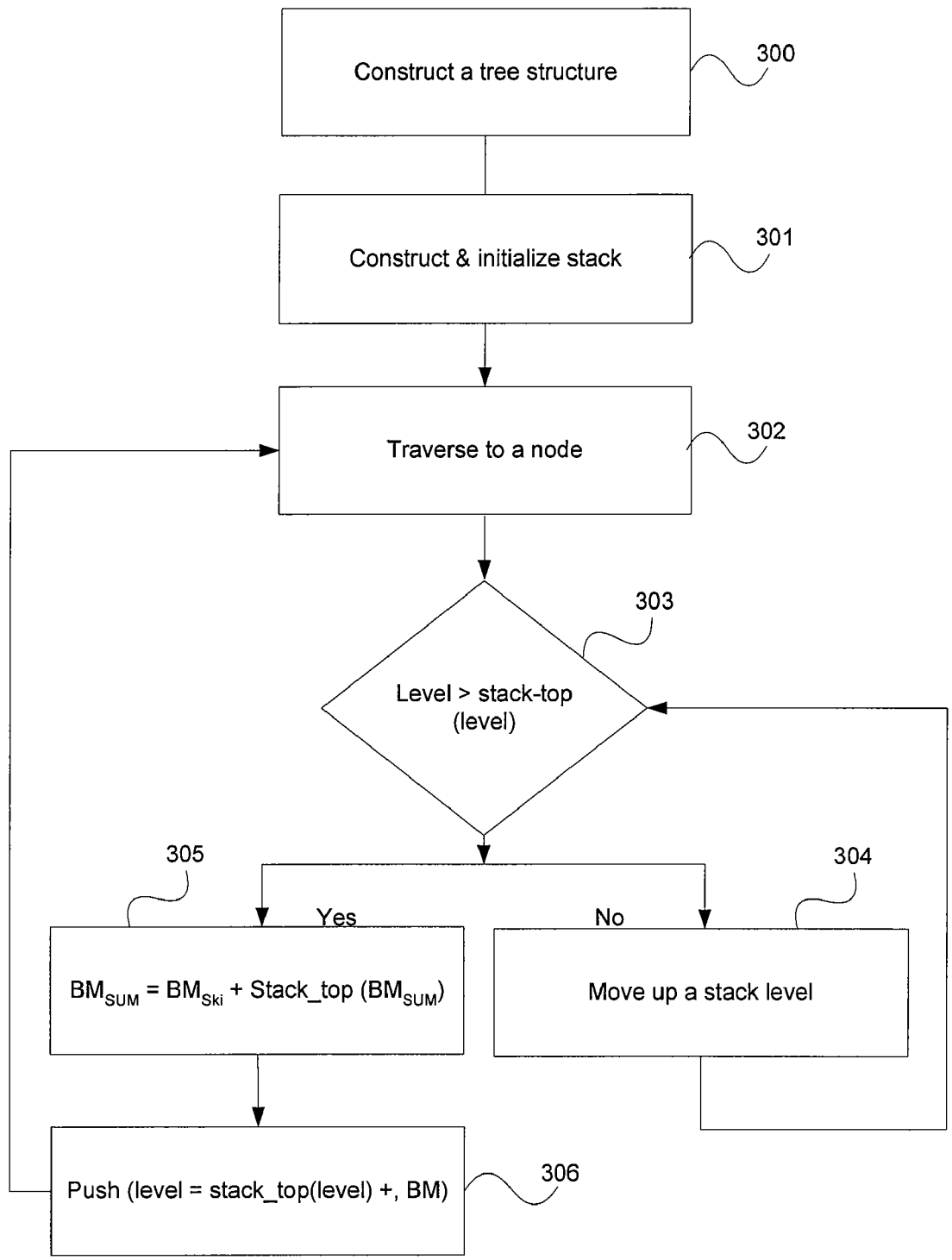
FIG. 3 is a simplified flow diagram illustrating a method for determining an LLR value according to an embodiment of the preset invention.

As can be seen, the modified Euclid distance $\tilde{d}(\vec{r}_{sub}, \vec{s}'_{sub})$ of each leaf node is equivalent to the sum of the path measurement from the root node to the leaf node. According to a specific embodiment an algorithm, which may be implemented in a network system, is described below. FIG. 3 is a simplified flow diagram illustrating a method for determining an LLR value according to an embodiment of the preset invention. This diagram is merely an example, which should not unduly limit the scope of the claims. One of ordinary skill in the art would recognize many variations, alternatives, and modifications. It is to be understood that the various modification and alternation may be made to implement the embodiment, which should not unduly limit the scope of claims. For example, various steps may be added, removed, replaced, repeated, overlapped, and/or partially overlapped.

As explained earlier, to determine the LLR value, the probability values for both $b_i$=0 and $b_i$=1 are calculated.

At step 300, a tree for the purpose of calculating the probability for $b_i$=0 is constructed. For example, the tree is the tree 200 as shown in FIG. 2. As explained above, nodes of the tree correspond to a permutation of symbols that might have been used for modulation.

At step 301, a stack data structure for storing value is constructed and initialized. For example, a stack data structure stores data in a last-in-first-out (LIFO) manner. According to an embodiment, a stack is used to concisely and efficiently compute and cache the sum of the path measurement from the root node to certain node $BM_{sum}$, and the stack is used to store ordered pairs. For example, the each ordered pair stores (level number, BM sum). During the initialization process, an ordered pair the ordered pair (level=0, $BM_{sum}$=0) is pressed to the top of the stack.

At step 302, the tree is traversed, which reaches a node of the tree. Depending upon application, traversal of the tree may be done in various ways. For example, iterative or recursive traversal of the tree may be used. According to an embodiment, the tree is traversed according to a "depth first" order. For example, the embodiment uses a traversal to reach to the lowest level node first of a branch before traversing to other branches.

At step 303, a determination of a BM is made for the level of the current node. According to an embodiment, whether the level of the current node is higher than Stack_Top(level) is determined. Based on this determination, if the level of the current node is higher than Stack_Top(level), the process proceeds to step 305. On the other hand, if the level of the current node is less than or equal to Stack_Top(level), the process proceeds to step 304.

At step 304, the stack level is unwound, and the process goes back to step 303. As shown in FIG. 3, the process of unwinding stack level repeats until the level of the current node is higher than Stack_Top(level), then the process proceeds to step 305.

At step 305, the branch metric value for the traversed node is calculated and updated. According to an embodiment, the following equation is used.

$$BM_{sum} = BM_{s'_{k_i}} + \text{Stack\_Top}(BM_{sum}) \quad \text{(Equation 17)}$$

As shown in Equation 17, the $BM_{sum}$ value for each node is the sum of the branch metric values of lower nodes.

At step 306, an ordered pair (level=Stack_Top(level)+1, $BM_{sum}$) is placed on the top of the stack data structure. For example, the branch metric value is stored. After step 306 is finished, the process proceeds to step 302, which traverses to the next node.

As described above, at step 302 each of node is traversed and the branch metric value for the traversed node is determined. Once every node of the tree is traversed, the stack data structure includes branch metric value for each node of the tree. For example, the stack data structure provides that $$BM_{sum} = \sum_i BM_{s'_{k_i}}.$$

Since the modified Euclid distance $\tilde{d}(\vec{r}_{sub}, \vec{s}'_{sub})$ is a function of $BM_{sum}$, the modified Euclid distance can be obtained from the stack for each node of the tree.

The process described above can be used for calculating the Euclid distances for both $b_i$=0 and $b_i$=1. For example, an independent stack data structure is used for $b_i$=1 Euclid distance calculation. Once the Euclid distances are calculated, the LLR value can be obtained according to the following equation.

$$LLR(b_i) = \ln\left(\frac{\sum_{\vec{s}'_{sub}\in set(b_i=0)} e^{-\tilde{d}(\vec{r}_{sub},\vec{s}'_{sub})}}{\sum_{\vec{s}'_{sub}\in set(b_i=1)} e^{-\tilde{d}(\vec{r}_{sub},\vec{s}'_{sub})}}\right) \quad \text{(Equation 18)}$$

As explained above, the calculation of LLR value according to Equation 18 is based on Equation 12 derived. It is to be appreciated that Equation 18 as presented and used according to various embodiments of the present invention provides a more accurate determination of the LLR value as compared to conventional techniques.

It is to be understood that the method illustrated according to FIG. 3 may be implemented in various types of networks. According to certain embodiments, the method may be implemented with existing wireless network entities. For example, the method may be implemented using built-in processors of wireless network devices.

The process that involves Equation 18 for determining the LLR value as explained above involves many steps and therefore costs much processing resource. For example, the total numbers of Euclid distances that are required for the calculation performed according to Equation 18 is determined according to the following equation.

$$N_{\text{Euclid\_Distance}} = 2 * \prod_{j=1}^{count(b_i)} 2^{M\_order(s_{k_j})-1} \quad \text{(Equation 19)}$$

As can be seen, the number of calculation required to determine LLR value using Equation 18 grows exponentially based on the number of modulation symbols used. It is therefore to be appreciated that according to certain embodiments, the present invention provides a technique for determining the LLR value with a reduced number of calculations.

Figure 4:
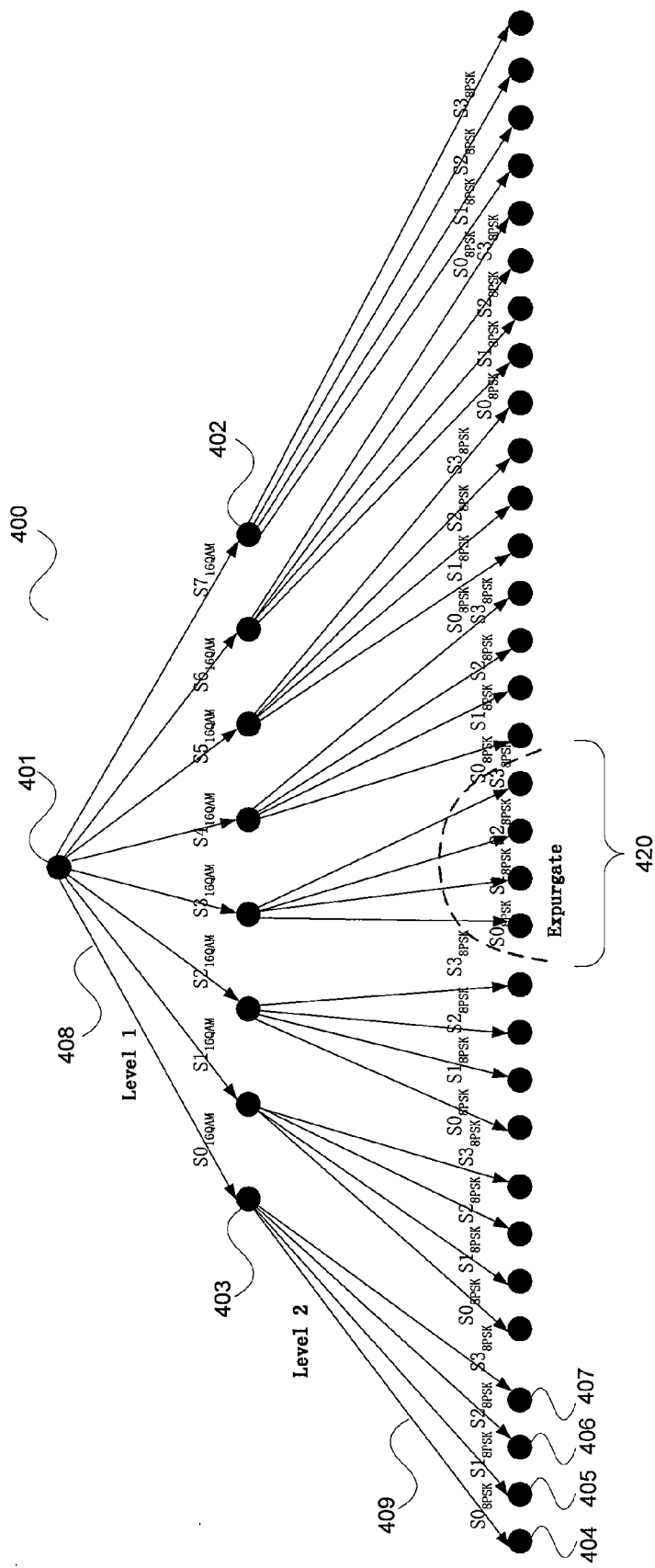
FIG. 4 is a simplified diagram of a tree structure used for facilitating LLR value determination according to an alternative embodiment of the present invention.

According to certain embodiments of the present invention, an approximation of LLR value is determined based on Equation 15. As an example, a tree structure similar to the tree 200 in FIG. 2 is used to provide possible permutations of demodulation symbols that were used, and the tree structure has a reduced number of nodes so that the number of calculations is reduced. FIG. 4 is a simplified diagram of a tree structure used for facilitating LLR value determination according to an alternative embodiment of the present invention. This diagram is merely an example, which should not unduly limit the scope of the claims. One of ordinary skill in the art would recognize many variations, alternatives, and modifications.

As shown in FIG. 4, the root node 401 represents the total probability of a code bit to be either zero or one. According to an embodiment, the tree 400 is constructed according to $$\vec{s}'_{sub} = (s_{k_1}, s_{k_2}, \ldots, s_{k_{count(b_i)}})$$

sequence, in which the sequence is arranged from the largest to the smallest according to the signal noise ratio. Each of the connecting line between two nodes represents a modulation. For example, line 408 represents the probability of a bit being modulated with modulation code s0 at node 403. Similarly, line 409 represents the probability of a bit being modulated with modulation code s0 at node 403 and modulated with modulation code s0 again at node 404. According to various embodiments, certain nodes (node group 420 shown in FIG. 4) of the tree 400 are expurgated so no calculations are performed for these nodes, thereby reducing the total amount of processing resource needed for determining the LLR value. For example, nodes are expurgated when it is determined that the calculation of branch metric values for these nodes are not needed (e.g., the branch metric of these nodes is greater than a minimum value).

As an explained above, by using Equation 15 to determine an approximate value for LLR, the number of calculations that needs to be performed is reduced. According to certain embodiments, a tree (e.g., the tree 400 as described above) is used in conjunction with the following equation for calculating LLR.

$$LLR(b_i) \approx$$
$$(-1) \left( \min_{\vec{s}'_{sub} \in set(b_i=0)} \tilde{d}(\vec{r}_{sub}, \vec{s}'_{sub}) - \min_{\vec{s}'_{sub} \in set(b_i=1)} \tilde{d}(\vec{r}_{sub}, \vec{s}'_{sub}) \right)$$
(Equation 20)

As an example, a method for approximating the LLR value is based on Equation 15.

Figure 5:
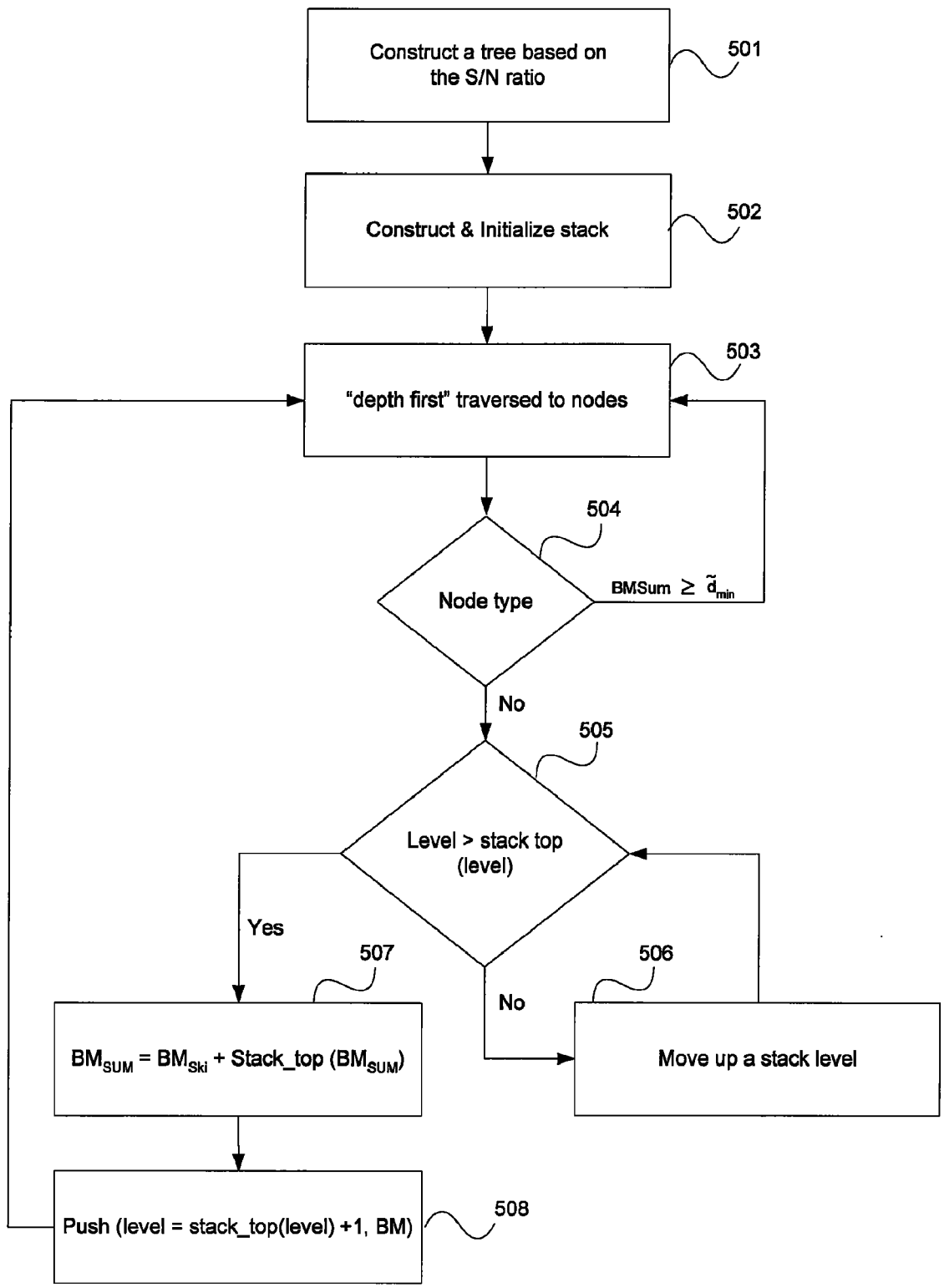
FIG. 5 is a simplified diagram illustrating a method for determining an LLR value according to another embodiment of the preset invention.

FIG. 5 is a simplified diagram illustrating a method for determining an LLR value according to another embodiment of the preset invention. This diagram is merely an example, which should not unduly limit the scope of the claims. One of ordinary skill in the art would recognize many variations, alternatives, and modifications. It is to be understood that the various modification and alternation may be made to implement the embodiment, which should not unduly limit the scope of claims. For example, various steps may be added, removed, replaced, repeated, overlapped, and/or partially overlapped.

As explained earlier, to determine the LLR value, the probability values for both $b_i=0$ and $b_i=1$ are calculated.

At step 501, a tree for the purpose of calculating the probability for $b_i=0$ is constructed. For example, the tree is the tree 200 as shown in FIG. 2. As explained above, nodes of the tree correspond to a permutation of symbols that might have been used for modulation.

At step 502, a stack data structure for storing value is constructed and initialized. For example, a stack data structure stores data in a last-in-first-out (LIFO) manner. According to an embodiment, a stack is used to concisely and efficiently compute and cache the sum of the path measurement from the root node to certain node $BM_{sum}$, and the stack is used to store ordered pairs. For example, the each ordered pair stores (level number, BM sum). During the initialization process, the ordered pair (level=0, $BM_{sum}=0$) is pressed to the top of the stack.

At step 503, the tree is traversed, which reaches a node of the tree. Depending upon application, traversal of the tree may be done in various ways. For example, iterative or recursive traversal of the tree may be used. According to an embodiment, the tree is traverse according to a "depth first" order. For example, the embodiment uses a traversal to reach to the lowest level node first of a branch before traversing to other branches.

At step 504, a determination is made for the current node for the type of node. According to the embodiment, the node type determines whether further calculation for BM value is required. If the currently known BM value for the node is greater than a threshold minimum value, the traversal and calculation of BM for the current node is terminated, and the processes moves back to step 503 (i.e., traversing the next branch of nodes). For example, the threshold minimum value is constantly update as newly determine BM values for certain nodes are less than the threshold minimum value. As an example, there is no need to further calculate BM values of branches below the current node, as the current nodes already has BM value than the minimum value and thus the entire branch (i.e., the sum of all branches) associated with the current node cannot possibly include the minimum value. On the other hand, if the currently the BM value for the node is less than a minimum value, and the processes proceeds to step 505.

At step 505, a determination of a BM is made for the level of the current node. According to an embodiment, whether the level of the current node is higher than Stack_Top(level) is determined. Based on the this determination, if the level of the current node is higher than Stack_Top(level), the process proceeds to step 507. On the other hand, if the level of the current node is less than or equal to Stack_Top(level), the process proceeds to step 506.

At step 506, the stack level is unwinded, and the process goes back to step 505. As shown in FIG. 5, the process of unwinding stack level repeats until the level of the current node is higher than Stack_Top(level), then the process proceeds to step 507.

At step 507, the branch metric value for the traversed node is calculated and updated. According to an embodiment, the following equation is used.

$$BM_{sum} = BM_{s'_{k_i}} + \text{Stack\_Top}(BM_{sum})$$
(Equation 21)

As shown in Equation 21, the $BM_{sum}$ value for each node is the sum of the branch metric values of lower nodes.

At step 508, an ordered pair (level=Stack_Top(level)+1, $BM_{sum}$) is placed on the top of the stack data structure. For example, the branch metric value is stored. After step 508 is finished, the process proceeds to step 503, which traverses to the next node.

After each branch is traversed (except branches containing BM value greater than the threshold minimum value), branch values for most of the nodes are determined. Next, branch values are compared and a minimum branch value is determined.

The process as illustrated according to FIG. 5 may be used to determine the minimum probability values for both b=0 and b=1. The minimum probability values are then used to determine an approximate LLR value according to Equation 20.

According to an embodiment, the present invention provides a method for demodulating data signals. The method includes a step for receiving modulated data over a medium. The modulated data represents a plurality of bits, which includes at least a first bit. For example, the first bit is modulated by a number of modulation processes using a sequence of modulation symbols, and each of the sequence of modulation symbols is selected from a first plurality of modulation symbols. The method also includes a step for processing information associated with the first plurality of modulation symbols and the number of modulation processes. Also, the method includes a step for determining a plurality of sequences of modulation symbols based on at least information associated with the first plurality of modulation symbols and the number of modulation processes. The method further includes a step for determining a first plurality of probability values for the first bit being zero. As an example, each of the probability values is associated with one of the plurality of sequences and the modulated data. Additionally, the method includes a step for determining a second plurality of probability values for the first bit being nonzero. For example, each of the probability values being associated with one of the plurality of sequences and the modulated data. The method also includes a step for determining a first sum associated with the first plurality of probability values. The method further includes a step for determining a second sum associated with the second plurality of probability values. Furthermore, the method includes a step for determining a ratio between the first sum and the second sum.

According to another embodiment, the present invention provides a method for demodulating received data signals. The method includes a step for receiving modulated data from a data source over a medium. For example, the modulated data represents a plurality of bits, which include at least a first bit. For example, the first bit is modulated by the data source using a predetermined first plurality of modulation symbols. The first plurality of modulation symbols is a subset of a second plurality of modulation symbols. The method also includes a step for determining a number of modulation symbols used for modulating the first bit. Additionally, the method includes a step for providing a set of permutations of possible modulation symbols based on the number of modulation symbols. Furthermore, the method includes a step for providing a noise value that is associated with the medium. The method further provides a step for providing an attenuation value that is associated with the medium. The method additionally includes a step for determining a first minimum value for a first plurality of probability values for first bit being zero. For example, each of the probability values is associated with a permutation, and each of the probability values is a function of the noise value, the attenuation value, and the modulated data. Also, the method includes a step for determining a second minimum value for second plurality of probability values for first bit being nonzero. As an example, each of the probability values is associated with a permutation, and each of the probability values further being a function of the noise value, the attenuation value, and the modulated data. Moreover, the method includes a step for determining a ratio between the first minimum value and the second minimum value.

According to yet another embodiment, the present invention provides a method for demodulating received signals. The method includes a step for receiving modulated data from a data source over a medium. The modulated data represents a plurality of bits, which includes at least a first bit. For example, the first bit is modulated by the data source using a known number of a predetermined first plurality of modulation symbols. The first plurality of modulation symbols is a subset of a second plurality of modulation symbols. The method additionally includes a step for determining a number of modulation symbols used for modulating the first bit. The method further includes a step for providing a noise value, which is associated with the medium. The method also includes a step for providing an attenuation value, which is associated with the medium. In addition, the method includes a step for providing a first tree structure for determining a likelihood of the first bit being zero. For example, the first tree structure includes a number of branch levels. The number of levels is equal to known number of the predetermined first plurality of modulation symbols. The first tree includes a first plurality of nodes. The method additionally includes a step for determining a first plurality of branch value. For example, each of the branch values is associated with a node from the first plurality of nodes. Also, the method includes a step for determining a first sum based on the first plurality of branch values. Moreover, the method includes a step for providing a second tree structure for determining a likelihood of the first bit being non-zero. For example, the second tree structure includes the number of branch levels, the second tree including a second plurality of nodes. The method also includes a step for determining a second plurality of branch values, and each of the branch values is associated with a node from the second plurality of nodes. Furthermore, the method includes a step for determining a second sum based on the second plurality of branch values. Also, the method includes a step for determining a ratio between the first sum and the second sum.

According to yet another embodiment, the present invention provides a method for demodulating received data signals. The method includes a step for receiving modulated data from a data source over a medium. The modulated data represents a plurality of bits, which includes at least a first bit. As an example, the first bit is modulated by the data source using a known number of a predetermined first plurality of modulation symbols. The first plurality of modulation symbols is a subset of a second plurality of modulation symbols. The method also includes a step for determining a number of modulation symbols used for modulating the first bit. The method additionally includes a step for providing a noise value, which is associated with the medium. The method additionally includes a step for providing an attenuation value, which is associated with the medium. The method further includes a step for providing a first tree structure for determining a likelihood of the first bit being zero. The first tree structure includes a number of branch levels. For example, the number of levels is equal to known number of the predetermined first plurality of modulation symbols. The first tree includes a first plurality of nodes. The method also includes a step for determining a first plurality of branch values, and each of the branch values is associated with a node from the first plurality of nodes. Furthermore, the method includes a step for determining a first minimum based on the first plurality of branch values. Moreover, the method includes a step for providing a second tree structure for determining a likelihood of the first bit being non-zero. The second tree structure includes the number of branch levels. The second tree includes a second plurality of nodes. The method additionally includes a step for determining a second plurality of branch values, and each of the branch values being associated with a node from the second plurality of nodes. The method additionally includes a step for determining a second minimum based on the second plurality of branch values. The method also includes a step for determining a ratio between the first minimum and the second minimum.

According to yet another embodiment, the present invention provides a system for demodulating data signals. The system includes a communication interface that is configured for receiving modulated data over a medium. The modulated data represents a plurality of bits, which includes at least a first bit. As an example, the first bit is modulated by a number of modulation processes using a sequence of modulation symbols. Each of the sequence of modulation symbols is selected from a first plurality of modulation symbols. The system also includes a processor that is configured to process information associated with the first plurality of modulation symbols and the number of modulation processes. The processor is also configured to determine a plurality of sequences of modulation symbols based on at least information associated with the first plurality of modulation symbols and the number of modulation processes. The processor is additionally configured to determine a first plurality of probability values for the first bit being zero, and each of the probability values is associated with one of the plurality of sequences and the modulated data. The processor is additionally configured to determine a second plurality of probability values for the first bit being nonzero, and each of the probability values is associated with one of the plurality of sequences and the modulated data. Also, the processor is configured to determine a first sum associated with the first plurality of probability values. The processor is further configured to determine a second sum associated with the second plurality of probability values. Moreover, the processor is configured to determine a ratio between the first sum and the second sum.

It is to be appreciated that embodiments of the present invention provide various advantages over conventional techniques. Among other things, various embodiments of the present invention provides a more accurate way for determining log likelihood ratio associated with data transmission, as illustrated in the specification of the application. In addition, certain embodiments of the present invention provide a method for approximating the log likelihood value in an efficient manner. Additionally, various embodiments of the present invention are compatible with conventional process technology without substantial modifications to conventional equipment and processes. Depending upon the embodiment, one or more of these benefits may be achieved.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A system for demodulating received data signals comprising:
    a communication interface being configured for receiving modulated data from a data source over a medium, the modulated data representing a plurality of bits, the plurality of bits including at least a first bit, the first bit being modulated by the data source using a predetermined first plurality of modulation symbols, the first plurality of modulation symbols being a subset of a second plurality of modulation symbols; and
    a processor coupled with the communication interface, the processor being configured to:
    determine a number of modulation symbols used for modulating the first bit;
    provide a set of permutations of possible modulation symbols based on the number of modulation symbols;
    provide a noise value, the noise value being associated with the medium;
    provide an attenuation value, the attenuation value being associated with the medium;
    determine a first minimum value for a first plurality of probability values for first bit being zero, each of the probability values being associated with a permutation, each of the probability values further being a function of the noise value, the attenuation value, and the modulated data;
    determine a second minimum value for second plurality of probability values for first bit being nonzero, each of the probability values being associated with a permutation, each of the probability values further being a function of the noise value, the attenuation value, and the modulated data; and
    determine a ratio between the first minimum value and the second minimum value.

2. The system for claim 1 wherein, the medium is characterized by an attenuation value and an noise value, and wherein the processor is further configured to determine that a first plurality of probability values is based on at least the attenuation value and the noise value.

3. The system for claim 1, wherein the determination of the first minimum value further includes the processor being configured to:
    calculate a first probability value associated with a first permutation; and
    compare the first probability value with the first minimum value, wherein the first minimum value is equal to the first probability value if the first minimum value is greater than the first probability value.

4. A system for demodulating data signals comprising:
    a communication interface being configured for receiving modulated data from a data source over a medium, the modulated data representing a plurality of bits, the plurality of bits including at least a first bit, the first bit being modulated by the data source using a known number of a predetermined first plurality of modulation symbols, the first plurality of modulation symbols being a subset of a second plurality of modulation symbols; and
    a processor coupled with the communication interface, the processor being configured to:
    determine a number of modulation symbols used for modulating the first bit;
    provide a noise value, the noise value being associated with the medium;
    provide an attenuation value, the attenuation value being associated with the medium;
    provide a first tree structure for determining a likelihood of the first bit being zero, the first tree structure including a number of branch levels, the number of levels being equal to known number of the predetermined first plurality of modulation symbols, the first tree including a first plurality of nodes;
    determine a first plurality of branch values, each of the branch values being associated with a node from the first plurality of nodes;
    determine a first sum based on the first plurality of branch values;
    provide a second tree structure for determining a likelihood of the first bit being non-zero, the second tree structure including the number of branch levels, the second tree including a second plurality of nodes;
    determine a second plurality of branch values, each of the branch values being associated with a node from the second plurality of nodes;
    determine a second sum based on the second plurality of branch values; and
    determine a ratio between the first sum and the second sum.

5. The system for claim 4, wherein the medium is characterized by a noise value.

6. The system for claim 4, wherein the medium is characterized by an attenuation value.

7. The system for claim 4, wherein each of the plurality of sequences of modulation symbols includes a number of modulation symbols.

8. The system for claim 4, wherein at least two of the sequence of modulation symbols are the same.

9. system for claim 4, wherein all of the sequence of modulation symbols are different.

10. The system for claim 4, wherein the processor further being configured to determine whether to send a request for resending data based on the ratio.

11. The system for claim 4, wherein the processor further being configured to determine whether the received modulated data needs to be resent based on the ratio.

12. The system for claim 4, wherein the processor further being configured to determine a likelihood of the first bit being zero.

13. The system for claim 4, wherein the processor further being configured to determine a likelihood of the first bit being nonzero.

14. The system of claim 4 wherein the ratio is a log likelihood ratio.

15. A system for demodulating data signals comprising:
a communication interface being configured for receiving modulated data from a data source over a medium, the modulated data representing a plurality of bits, the plurality of bits including at least a first bit, the first bit being modulated by the data source using a known number of a predetermined first plurality of modulation symbols, the first plurality of modulation symbols being a subset of a second plurality of modulation symbols; and
a processor coupled with the communication interface, the processor being configured to:
determine a number of modulation symbols used for modulating the first bit;
provide a noise value, the noise value being associated with the medium;
provide an attenuation value, the attenuation value being associated with the medium;
provide a first tree structure for determining a likelihood of the first bit being zero, the first tree structure including a number of branch levels, the number of levels being equal to known number of the predetermined first plurality of modulation symbols, the first tree including a first plurality of nodes;
determine a first plurality of branch values, each of the branch values being associated with a node from the first plurality of nodes;
determine a first minimum based on the first plurality of branch values;
provide a second tree structure for determining a likelihood of the first bit being non-zero, the second tree structure including the number of branch levels, the second tree including a second plurality of nodes;
determine a second plurality of branch values, each of the branch values being associated with a node from the second plurality of nodes;
determine a second minimum based on the second plurality of branch values; and
determine a difference between the first minimum and the second minimum.

16. The system of claim 15 wherein the first plurality of branch values are associated with probabilities of modulation sequences being used for modulating data.

17. The system of claim 15, wherein the processor further being configured to store branch values in one or more stacks.

18. The method system of claim 15, wherein the ratio includes a log likelihood ratio.

19. The system of claim 15, further comprising a memory component being configured to store the first plurality of probability values.

* * * * *